Figure 1:
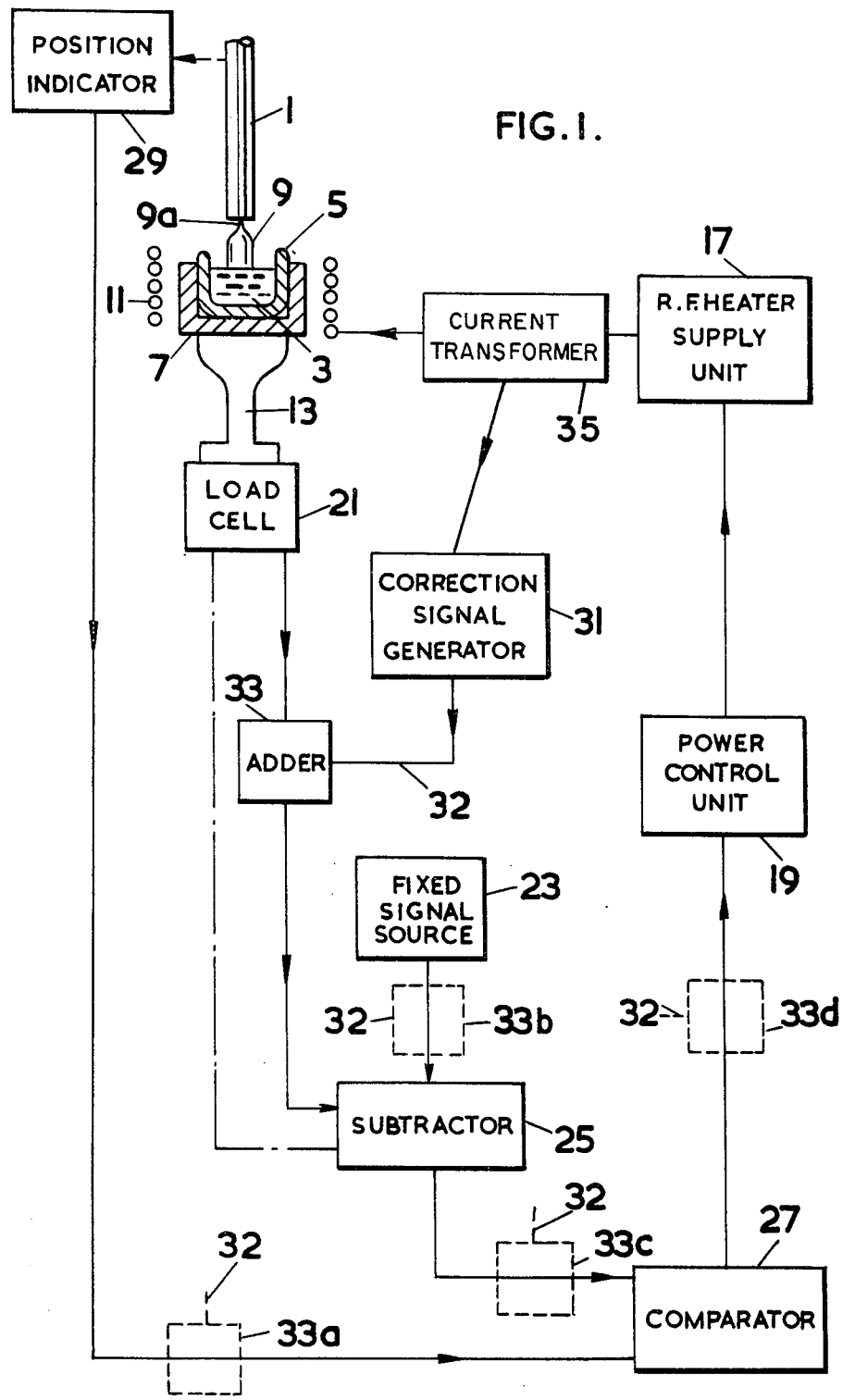

United States Patent [19]

Green et al.

[11] 4,008,387
[45] Feb. 15, 1977

[54] AUTOMATICALLY CONTROLLED CRYSTAL GROWTH

[75] Inventors: Geoffrey William Green, Malvern; Donald Thomas James Hurle, Welland; Gordon Charles Joyce, Malvern, all of England

[73] Assignee: National Research Development Corporation, London, England

[22] Filed: Mar. 31, 1975

[21] Appl. No.: 563,441

[30] Foreign Application Priority Data

Mar. 29, 1974 United Kingdom ............ 14162/74

[52] U.S. Cl. .................... 235/151.1; 23/273 SP; 235/151.12
[51] Int. Cl.² .................... B01J 17/18; G06G 7/66
[58] Field of Search .......... 235/150, 151.1, 151.12; 23/273 SP, 301; 156/601; 13/DIG. 1

[56] References Cited

UNITED STATES PATENTS

| | | | |
|---|---|---|---|
| 2,686,864 | 8/1954 | Wroughton et al. ........... | 23/273 SP |
| 2,686,865 | 8/1954 | Kelly, Jr. .................... | 23/273 SP |
| 2,908,004 | 10/1959 | Levinson ...................... | 23/273 SP |
| 3,284,172 | 11/1966 | Binder ......................... | 23/273 SP |
| 3,617,392 | 11/1971 | Locke, Jr. .................... | 23/273 SP |
| 3,621,213 | 11/1971 | Jen et al. .................... | 235/151.12 |
| 3,832,626 | 8/1974 | Stut ........................... | 23/273 SP |

Primary Examiner—Felix D. Gruber
Attorney, Agent, or Firm—Cushman, Darby & Cushman

[57] ABSTRACT

The Czochralski growth of a crystal may be automatically controlled to provide uniform crystal cross-sectional area by weighing the crucible containing the melt from which the crystal is grown and deriving a weight signal which is compared with its expected value to produce a feedback loop control signal to control the melt heater power. However a magnetic field will be associated with the melt heater current and the interaction of this field on the crucible can produce a levitation force which is recorded erroneously as part of the weight signal. This unwanted force can make the closed-loop control unstable. The error component in the weight signal is cancelled in the invention by deriving an equal and opposite component by monitoring the current supplied to the melt heater and adding the derived component to the weight signal in the feedback loop.

8 Claims, 2 Drawing Figures

AUTOMATICALLY CONTROLLED CRYSTAL GROWTH

The present invention relates to automatically controlled crystal growth.

A technique for growing crystals known as the pulling or Czochralski technique involves heating a material until molten in a crucible then dipping a seed crystal, attached to the lower end of a vertical pull rod, into the melt and slowly moving the rod upward to cause a crystal to grow on the seed by solidification from the melt. Since many materials grown as crystals by this technique are costly it is desirable to grow uniform crystals. This can be done by growing crystals of circular cross-section having a uniform diameter, or, more strictly cross-sectional area, along their length. In order to control the crystal diameter and cross-sectional area during pulling, the melt temperature can be adjusted by varying the electric current supplied to a heating coil surrounding the crucible, or by varying the speed at which the rod is raised or by varying the speed at which the rod is rotated about its own axis (if rotation of the rod is employed).

Since crystal pulling often takes many hours it is desirable to control the crystal cross-sectional area, ie maintain the temperature of the melt at a uniform level, automatically.

In some known devices this is done by continuously weighing the crucible to determine the change in weight of the melt and hence the increase in weight of the crystal, continuously comparing the change in weight of the crystal with the expected change in weight and employing any difference signal produced by the comparison to provide a control signal for controlling the crystal cross-sectional area, ie by applying a variation to the electric heating, or the pulling or rotational speed of the rod.

This invention is concerned with an automatically controlled Czochralski crystal growth arrangement of the kind, herein referred to as the "kind described", including an electrical heater for heating a material contained in a crucible to melt the material, means, incorporating an axially movable pull rod, for pulling a crystal from the melt of the material, and a feedback loop arranged to provide automatic control of the cross-sectional area of the crystal, the feedback loop including the crucible during pulling of the crystal to generate means for weighing a weight signal representing a function of the weight of the crystal, means for providing a reference signal consisting of the expected value of the weight signal and comparator means for comparing the weight signal and the reference signal and for producing from any difference between the two signals a control signal capable of controlling the current supplied to the electric heater.

This feedback loop will hereinafter be referred to as the "feedback loop described"

The function of the weight signal may be the weight signal itself or its time derivative.

According to the present invention a correction circuit for incorporation in the feedback loop of a crystal growth arrangement of the kind described includes a means for monitoring the electric current supplied to the electrical heater, means for deriving from the monitored current a correction signal proportional to the current and equal and opposite to the error component as hereinafter defined in the feedback loop and an adder for adding the correction signal to the feedback loop to cancel the error component.

If the current supplied to the electrical heater is alternating then the correction circuit may comprise a current transformer for monitoring the current, a rectifier and smoothing circuit for deriving a unidirectional signal proportional to the current, a potentiometer for selecting an appropriate fraction of the unidirectional signal and an adder.

The correction circuit is required for the following purpose. It has now been found that in a crystal growing arrangement of the kind described the automatic control can be unstabilised by an error, herein referred to as the "error component", in the signals fed around the feedback loop. The reason for this error component is as follows:

The current flowing through the heater produces a magnetic field which in turn produces a force on any conducting material, notably the crucible, within the magnetic field. This force normally has a component along the vertical axis of pulling: in other words the measured weight of the crucible is in error by an amount equal to the vertical component of the force. This error component is either positive or negative (ie the measured weight is too large or too small) depending on whether the net magnetic field at the conducting material is downward or upward. The correction circuit of the invention allows cancellation of the error component and hence stabilisation of the automatic control to be made.

The correction signal provided by the correction circuit may be applied at any one of several alternative places in the feedback loop.

Figure 2:
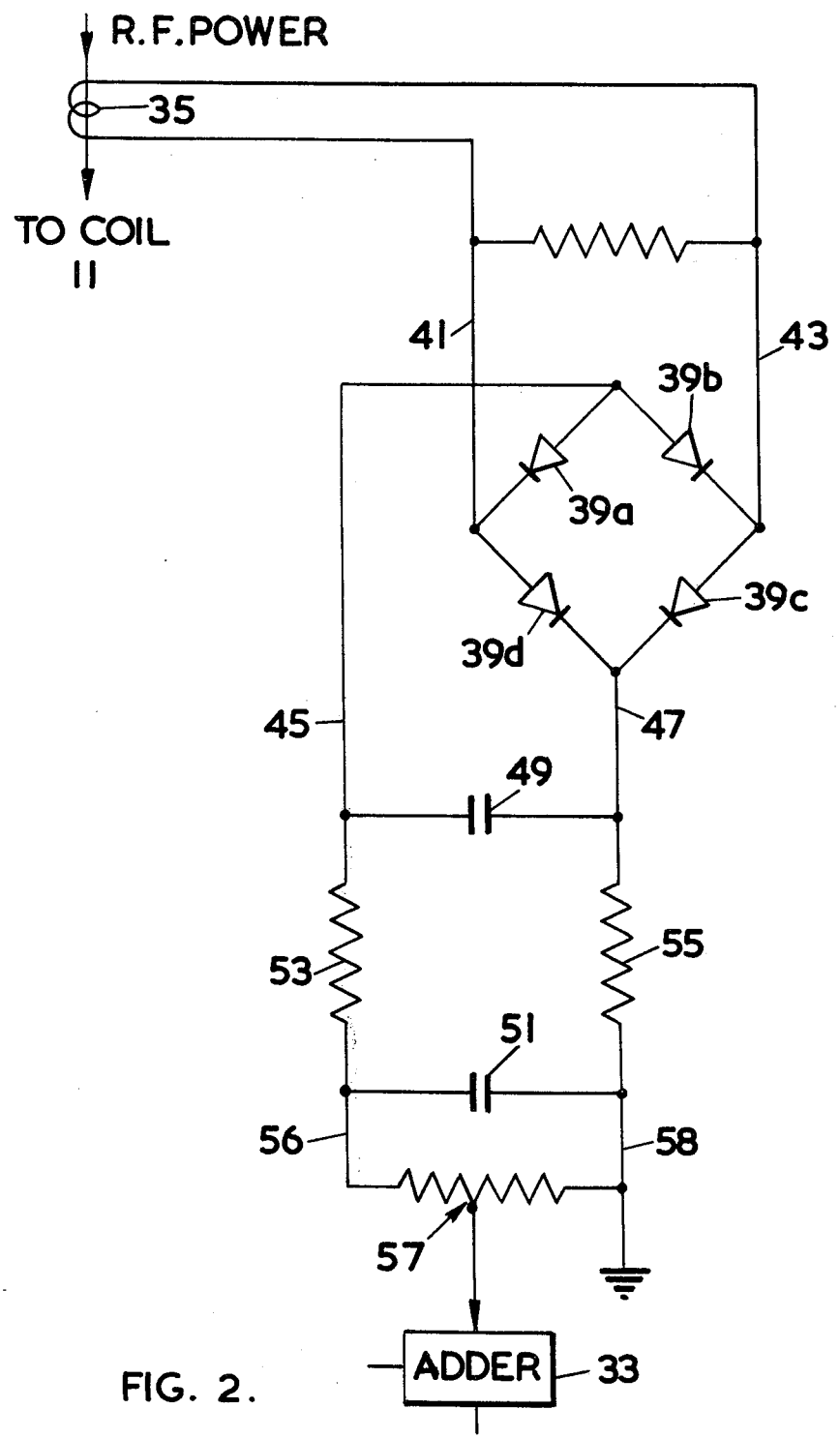

Embodiments of the present invention will now be described by way of example with reference to the accompanying drawings, in which:

FIG. 1 is a schematic diagram of a crystal growing arrangement embodying the invention; and FIG. 2 is a schematic circuit diagram of part of the arrangement illustrated in FIG. 1.

A rod 1 having a crystal seed 9a at its lower end is dipped into a melt 3 of a material of interest in a crucible 5 located in a conventional crystal growing vessel (not shown) and is then slowly raised and rotated in a conventional way causing a cylindrical crystal 9 to grow from the melt 3. The melt 3 is heated by the thermal conduction from a susceptor 7 surrounding the crucible 5. The susceptor 7 is heated by the eddy currents induced in it which are produced by R.F. radiation from an electrical coil 11 carrying R.F. current to the coil 11 by a conventional R.F. heater supply unit 17 which is controlled by a power control unit 19.

The diameter of the crystal 9 is automatically controlled during growth in the following way. The total weight of the melt 3, the crucible 5, the susceptor 7 and a support 13 for the susceptor 7 is monitored by a load cell 21, which may for instance be a load cell of the kind used in the arrangement described in copending U.S. patent application Ser. No. 395,172 filed Sept. 7, 1973 and now U.S. Pat. No. 3,934,983 issued on Jan. 27, 1976 to William Bardsley et. al. The output of the load cell 21 is a signal which represents the weight of the melt 3, the crucible 5, the susceptor 7 and the support 13. This signal is subtracted in a subtractor 25 from a fixed signal produced by a source 23, such as a potentiometer connected across a battery; the fixed signal represents the weight of the melt 3, the crucible 5, the susceptor 7 and the support 13 at some convenient reference or starting time, for example the time when the crystal 9 first reaches its desired uniform diameter after growing from the seed 9a. Thus the output of the subtractor 25 is a measurement of the loss of weight of the melt 3 which has occurred during growth of the crystal 9 since the reference time, which loss is equal to the increase in weight of the crystal 9 during that time. This measured increase in weight is compared in a comparator 27 with its expected value which is simply derived by a position indicator 29 from the change in position of a fixed point on the rod 1 which has occurred during the change in weight of the crystal 9, the change in position being directly proportional to the change in weight. The position indicator may for example be a potentiometer whose variable contact is arranged to be moved in co-operation with the movement of the rod 1, as described in U.S. Pat. No. 3,934,983.

Any difference between the two input signals to the comparator 27 results in an output from the comparator 27 and is used as a control signal to modulate the signal supplied by the power control unit 19, so that the power supplied by the supply unit 17 is raised or lowered as appropriate by the modulation, to raise or lower the temperature of the melt 3 and consequently to adjust the diameter of the crystal 9.

If the major part of the crucible 5 is above the centre of the coil 11, as shown in FIG. 1, then the vertical force component produced by the interaction of the magnetic field produced from the coil 11 and the crucible 5 is an upward force, ie a levitation. Thus the weight recorded by the load cell 21 is less than its correct value; in other words the error component of the weight signal is negative.

Assuming for example, a momentary increase occurs in the diameter of the crystal 9; this results in an unexpected increase in the weight of the crystal 9 and therefore the R.F. power is increased in the way described above to correct for the increase. However, the increase in R.F. power also increases the upward force on the crucible 5, so that the apparent weight of the crystal 9 as monitored decreases. The servo-loop comprising the subtractor 25, the comparator 27, and the power control unit 19 interpret the apparent loss of weight as a further increase in diameter and make a corresponding further increase in the R.F. power. Thus the diameter of the crystal 9 can depart considerably from its expected uniform value.

If the output of the load cell 21 (which contains the error component) is applied directly to the subtractor 25, as indicated by a chain-dotted line in FIG. 1, the problem outlined above arises. However, the problem is avoided by applying the output of the load cell 21 and the output of a correction signal generator 31 to an adder 33 as shown by full lines. The output of the correction signal generator 31 is arranged to be equal and opposite to the error component. Thus the output of the adder 31 is free from the error component. The correction signal generator 31 monitors the current supplied from the unit 17 to the coil 11 and produces an output derived from the monitored current.

The correction signal generator 31 may have the form illustrated in FIG. 2. A constant fraction of the R.F. current fed from the unit 17 to the coil 11 is picked up by a conventional current transformer 35 and fed to a conventional bridge rectifier comprising a resistor 37 connected across the current transformer 35, and a bridge formation of rectifying diodes 39a, b, c, and d, the input being applied between terminals 41 and 43 connected respectively to the diodes 39a and 39d and to the diodes 39b and 39c. The diodes 39a and 39d are arranged to conduct electrons respectively away from and towards the terminal 41, and the diodes 39b and 39c are arranged to conduct electrons respectively away from and towards the terminal 43. The output from the bridge, which consists of a series of unidirectional voltage pulses, is extracted between a terminal 45 connected to the diodes 39a and 39b and a terminal 47 connected to the diodes 39c and 39d. The output is smoothed in a conventional smoothing circuit comprising a capacitor 49 connected across the terminals 45 and 47, a capacitor 51 connected across the capacitor 49 and resistors 53 and 55 connected in the two respective arms between the capacitors 53 and 55. The output of the smoothing circuit which is extracted between terminals 56 and 58 connected across the capacitor 51, consists of a direct voltage. This is finally applied across a potentiometer 57, allowing a fraction of the voltage to be obtained for application to the adder 33 via a connection 32.

This constant fraction is proportional to the R.F. current supplied by the supply unit 17, to which the levitation force on the crucible 5 is proportional.

The correct fraction required from the potentiometer 57 is determined before growth of the crystal 9 is begun by measuring the change in output signal from the load cell 21 as a function of the change in R.F. power.

The adder 33, with the levitation corrector circuit 31 connected to it, may alternatively be located between the subtractor 25 and the comparator 27 or between the comparator 27 and the control unit 19 so that the correction is applied to the output of the subtractor 25 or the output of the comparator 27. Alternatively, the output of the levitation corrector circuit 31 may be reversed in sign, ie made negative, and added in the adder 33 either to the output of fixed signal source 23 or the output of the position indicator 29. Dashed boxes 33a, 33b, 33c and 33d in FIG. 1 represent these various alternative positions of the adder 33.

In an alternative embodiment of the invention the weight signal obtained as an output from the subtractor 25 is differentiated after correction and compared with a constant (its expected value) in the comparator 27. Otherwise, the arrangement is the same as described with reference to FIGS. 1 and 2 above.

We claim:

1. Apparatus for the controlled growth of a crystal comprising a container for containing a charge of material from which said crystal is grown; an electrical heater arranged adjacent to said charge to form a melt of said charge; means for pulling a crystal from said melt; a feedback loop for controlling the growth of said crystal by controlling energization of said heater, said feedback loop including: a weight function signal generator arranged so as to measure the weight of said melt and to provide an output signal representative of a function of said weight, a comparator, and means for supplying electrical current to said heater; means for providing a reference signal representative of the expected value of said generator output signal to said comparator for comparing said generator output signal with said reference signal and for providing for any difference between said signals a control signal for controlling the current supplied to said heater by said means for supplying current; and wherein the improvement comprises an error correction loop for cancelling an error in the weight measured by said weight function signal generator, said error correction loop including: means for monitoring the output of said means for supplying electrical current, means for deriving from said monitored current a correction signal proportional to said current and equal in magnitude to said error, and means for applying said correction signal to said feedback loop at a point in said feedback loop before said means for supplying current, in order to cancel said error.

2. Apparatus as claimed in claim 1 wherein said means for monitoring includes a current transformer and said means for deriving said correction signal includes a rectifier for rectifying output from said current transformer.

3. Apparatus as claimed in claim 2 wherein said means for deriving said correction signal further includes a smoothing circuit for smoothing output from said rectifier.

4. Apparatus as claimed in claim 2 wherein said means for deriving said correction signal further includes a potentiometer for selecting a fraction of output from said rectifier.

5. Apparatus as claimed in claim 4 wherein said rectifier is a diode bridge rectifier.

6. Apparatus as claimed in claim 1 wherein said weight function signal generator comprises a weighing cell and a device for subtracting an output signal of said weighing cell from a fixed signal representative of the fixed weight of said container and an initial reference weight of said melt, and wherein said means for applying said correction signal is an adder connected to said feedback loop between said weighing cell and said subtracting device.

7. Apparatus as claimed in claim 1 wherein said weight function signal generator comprises a weighing cell and a device for subtracting an output signal of said weighing cell from a fixed signal representative of the fixed weight of said container, and wherein said means for applying said correction signal is an added connected to said feedback loop between said subtracting device and said comparator.

8. Apparatus as claimed in claim 1 wherein said weight function signal generator comprises a weighing cell and a device for subtracting an output signal of said weighing cell from a fixed signal representative of the fixed weight of said container, and wherein said means for applying said correction signal is an adder connected to said feedback loop between said comparator and said means for supplying current.

* * * * *